(12) United States Patent
Stephan et al.

(10) Patent No.: US 11,910,544 B2
(45) Date of Patent: Feb. 20, 2024

(54) ASSEMBLY OF PRINTED CIRCUIT BOARD WITH OVERMOLDED EPOXY TO BASEPLATE

(71) Applicant: Vitesco Technologies USA, LLC, Auburn Hills, MI (US)

(72) Inventors: Uwe Stephan, Schaumburg, IL (US); Donald J. Zito, Fox River Grove, IL (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 17/661,652

(22) Filed: May 2, 2022

(65) Prior Publication Data

US 2023/0354530 A1    Nov. 2, 2023

(51) Int. Cl.
*H05K 5/00*    (2006.01)
(52) U.S. Cl.
CPC ................... *H05K 5/0034* (2013.01)

(58) Field of Classification Search
CPC .................................................. H05K 5/0034
See application file for complete search history.

(56) References Cited

U.S. PATENT DOCUMENTS

| 6,307,749 | B1 * | 10/2001 | Daanen | ............... | H05K 5/0034 |
| | | | | | 361/728 |
| 2019/0080931 | A1 * | 3/2019 | Ito | .......... | H01L 21/565 |
| 2020/0008292 | A1 * | 1/2020 | Sato | ......... | H03F 3/187 |

* cited by examiner

*Primary Examiner* — Hung V Ngo

(57) ABSTRACT

A control unit having a connection structure for connecting components of the control unit to a base plate which eliminates the need for separate fasteners. The control unit includes circuitry mounted to a PCB, and the PCB is pre-assembled to a base plate, to form a pre-assembly. During assembly, the PCB and the base plate are aligned when placed in a tooling device which clamps and holds the pre-assembly in place during the over molding process. The circuitry is over molded with an epoxy material, such that the epoxy material flows from a top side of the PCB to underneath the base plate, and the PCB is fixed to the base plate without the use of fasteners such as screws, or adhesive materials.

15 Claims, 7 Drawing Sheets

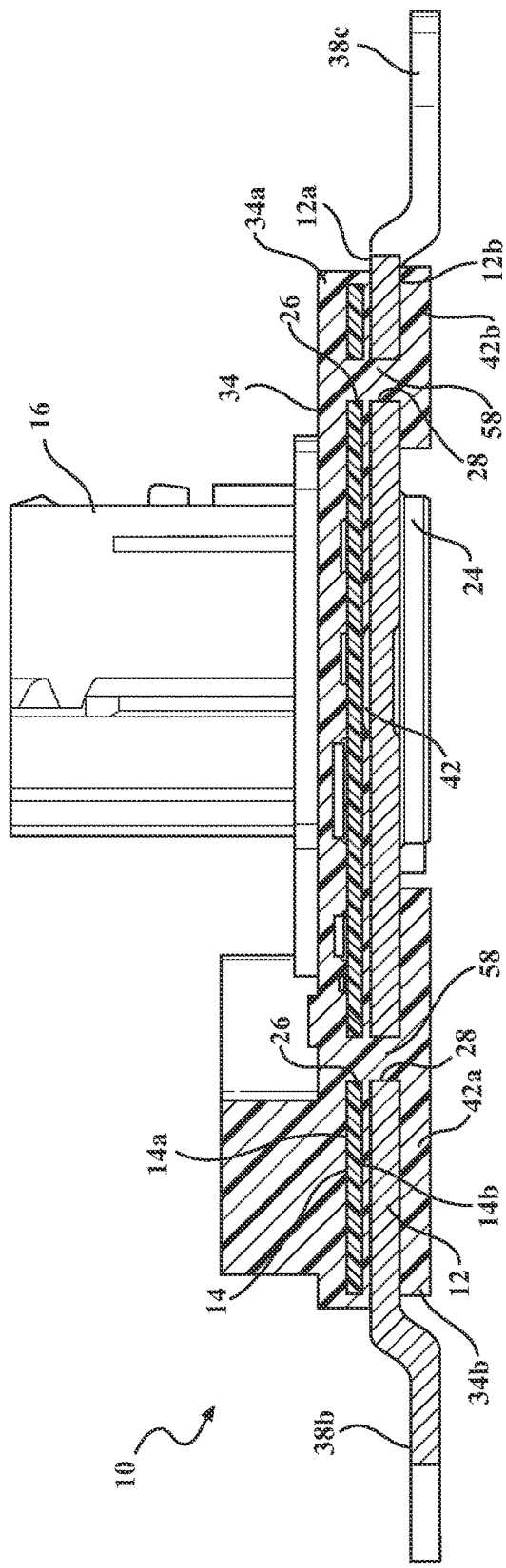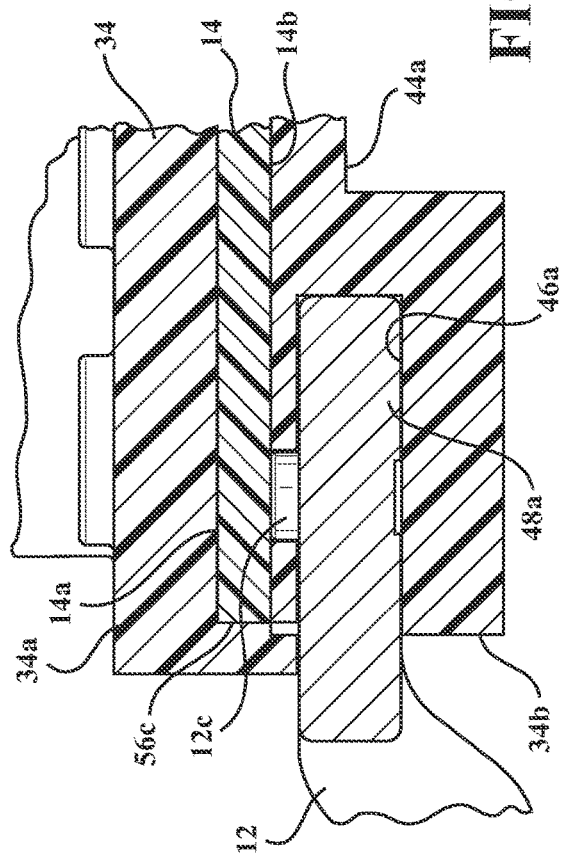

ASSEMBLY OF PRINTED CIRCUIT BOARD WITH OVERMOLDED EPOXY TO BASEPLATE

FIELD OF THE INVENTION

The invention relates generally to a control unit having a connection structure for connecting components of the control unit to a base plate using an overmolding process.

BACKGROUND OF THE INVENTION

Many applications use a control unit for controlling various components. Control units are used in various technology areas, such as automotive, medical, or computing devices. One type of control unit, such as a transmission control unit (TCU) is used to operate a transmission. TCUs typically include a printed circuit board (PCB) having various circuitry, and the PCB is mounted to a base plate. The PCB and base plate are then assembled into the cavity of a housing having various connectors which are in electrical communication with the PCB. The PCB is typically mounted to the baseplate using fasters or some type of adhesive, such as a thermally conductive adhesive.

Current control unit designs have fasteners, such as screws, or adhesive to attach the PCB to the base plate, prior to the PCB and the base plate being assembled into the housing. This is costly and requires several manufacturing steps.

Accordingly, there exists a need for a control unit which eliminates the need of separate fasteners used during assembly, and a separate housing.

SUMMARY OF THE INVENTION

In an embodiment, the present invention is a control unit having a connection structure for connecting components of the control unit to a base plate which is cost effective, and eliminates the need for separate fasteners. In an embodiment, the control unit is a transmission control unit, but it is within the scope of the invention the control unit may be suitable for any application where a control unit is needed.

In an embodiment, the control unit includes circuitry mounted to a PCB, and the PCB is mounted to a base plate. The circuitry is over molded with an epoxy material, such that the epoxy material flows from a top side of the PCB to underneath the base plate, such that the PCB is fixed to the base plate without the use of fasteners such as screws, or adhesive materials.

In an embodiment, the PCB is pre-assembled to the base plate, and this pre-assembly is over molded with an epoxy material to secure the PCB and the base plate together. In an embodiment, the PCB and the base plate are aligned when placed in a tooling device by several half-punches, or alignment standoffs, formed as part of the base plate, or retractable pins in the tooling device. The tooling device clamps and holds the pre-assembly in place during the over molding process. In this embodiment, the epoxy is used for mounting the PCB to the base plate, instead of using additional materials, such as an adhesive or fasteners.

In an embodiment, the PCB being mounted to the base plate using the over molding process results in no additional cost.

In an embodiment, the assembled PCB and base plate are over molded with an epoxy material. The epoxy material covers and protects the electronics mounted to the PCB. Compared to designs of current housings, the epoxy provides higher robustness and smaller packaging, while also securing the PCB to the base plate, eliminating the need for fasters or adhesive materials.

In an embodiment, there are four apertures in the PCB which are aligned with four apertures in the base plate when the PCB is placed in contact with the base plate to form the pre-assembly, where the epoxy flows through the apertures during the over mold process. The epoxy surrounds various parts of the PCB and the base plate, to connect the PCB and base plate together.

In an embodiment, the present invention is a control unit, including a base plate, a printed circuit board (PCB) connected to the base plate, and an encapsulation housing. In an embodiment, the base plate and the PCB are connected together by the encapsulation housing.

In an embodiment, the encapsulation housing includes a first layer disposed on a side of the PCB, a second layer disposed on a side of the base plate, and the first layer and the second layer are connected together and connect the PCB to the base plate.

In an embodiment, the control unit includes at least one flow aperture integrally formed as part of the base plate, and at least a portion of the encapsulation housing is disposed in the flow aperture, in between the first layer and the second layer.

In an embodiment, at least one recess is formed as part of the second layer of the encapsulation housing, and a portion of the base plate is adjacent the at least one recess.

In an embodiment, the control unit includes a first plurality of assembly apertures integrally formed as part of the PCB, and a second plurality of assembly apertures integrally formed as part of the base plate. In an embodiment, each of the first plurality of assembly apertures is aligned with a corresponding one of the second plurality of assembly apertures, and a portion of the encapsulation housing extends through each of the first plurality of assembly apertures and the second plurality of assembly apertures.

In an embodiment, the control unit includes circuitry mounted to the PCB, and at least a portion of the circuitry is covered by the encapsulation housing.

In an embodiment, a connector shroud is mounted to the PCB in an area of the PCB unoccupied by the encapsulation housing. At least one circumferential flange is part of the connector shroud and is in contact with the PCB. The circumferential flange is disposed between a portion of the encapsulation housing and the PCB, securing the connector shroud to the PCB.

In an embodiment, the control unit includes a cover integrally formed as part of the base plate, and a cavity integrally formed as part of the cover. A portion of the encapsulation housing is adjacent the cover, and the cover is adjacent the PCB in an area of the PCB unoccupied by the encapsulation housing.

In an embodiment, a circumferential lip is integrally formed as part of the base plate such that the circumferential lip circumscribes the cover, and a portion of the encapsulation housing is adjacent the circumferential lip.

In an embodiment, at least one groove is integrally formed as part of the encapsulation housing, and a portion of the base plate is disposed in the at least one groove, connecting the base plate and the encapsulation housing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 7 is a second sectional view taken along lines 6-6 of FIG. 1; and

FIG. 8 is an enlarged view of the circled portion of FIG. 5.

DETAILED DESCRIPTION OF THE PREFERRED EMBODIMENTS

The following description of the preferred embodiment(s) is merely exemplary in nature and is in no way intended to limit the invention, its application, or uses.

Figure 1:
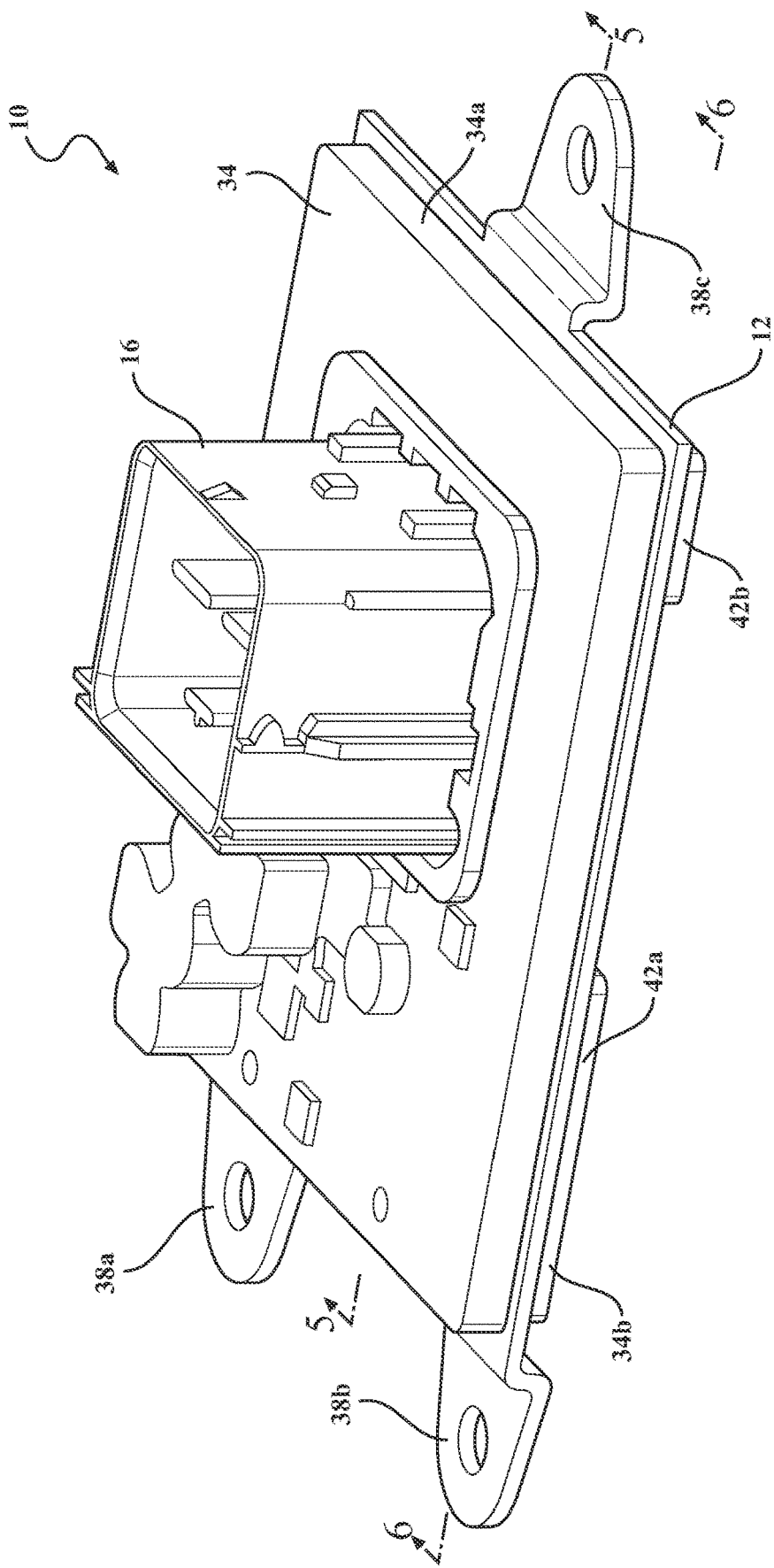
FIG. 1 is a first perspective view of a control unit, according to embodiments of the present invention.
Figure 2:
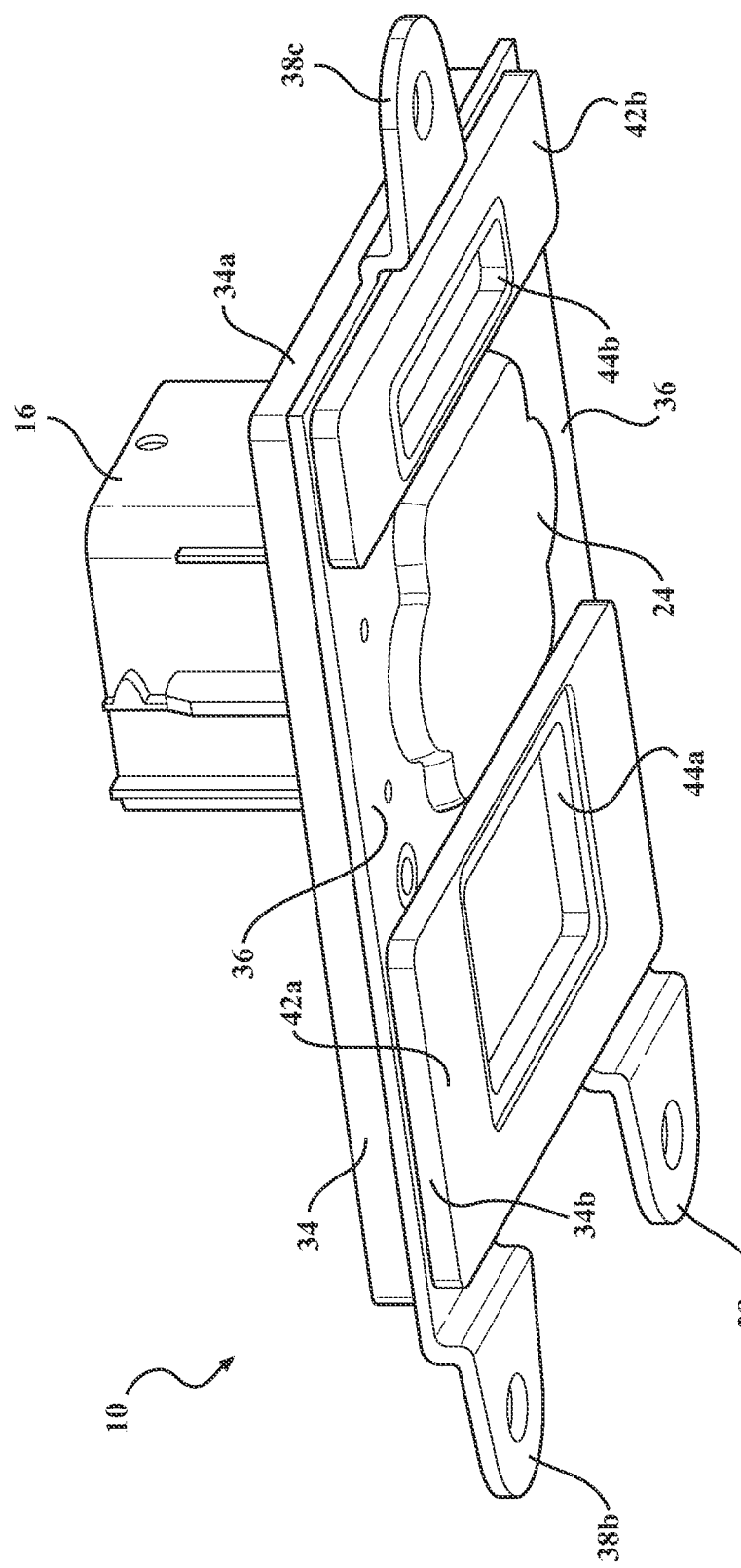
FIG. 2 is a second perspective view of a control unit, according to embodiments of the present invention.

An embodiment of a control unit having a connection structure according to the present invention is shown in FIGS. 1-2, generally at 10. Referring to FIGS. 3 and 5-8, the control unit 10 includes a base plate 12 having a first side 12a and a second side 12b, a printed circuit board (PCB) 14 having a first side 14a and a second side 14b, and a connector shroud 16.

Connected to the first side 14a of the PCB 14 is various circuitry, shown generally at 18. There is also a plurality of pins, shown generally at 20, which are connected to the first side 14a of the PCB 14 and are part of the circuitry 18. The pins 20 extend through the PCB 14 such that part of each of the pins 20 extends into a cavity, shown generally at 22, of a cover 24, where the cover 24 is integrally formed as part of the base plate 12.

Figure 3:
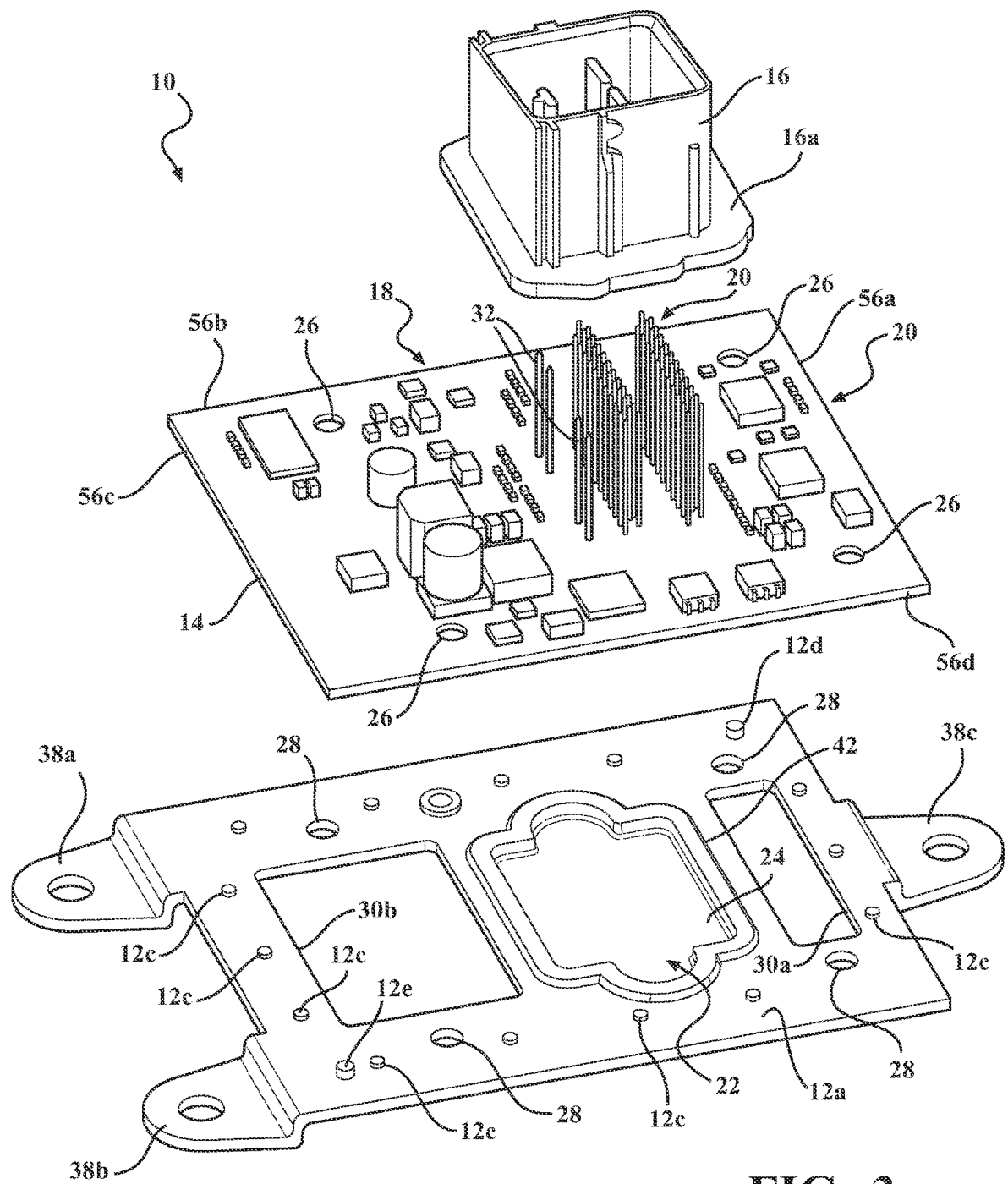
FIG. 3 is an exploded view of several components which are part of a control unit, according to embodiments of the present invention.
Figure 4:
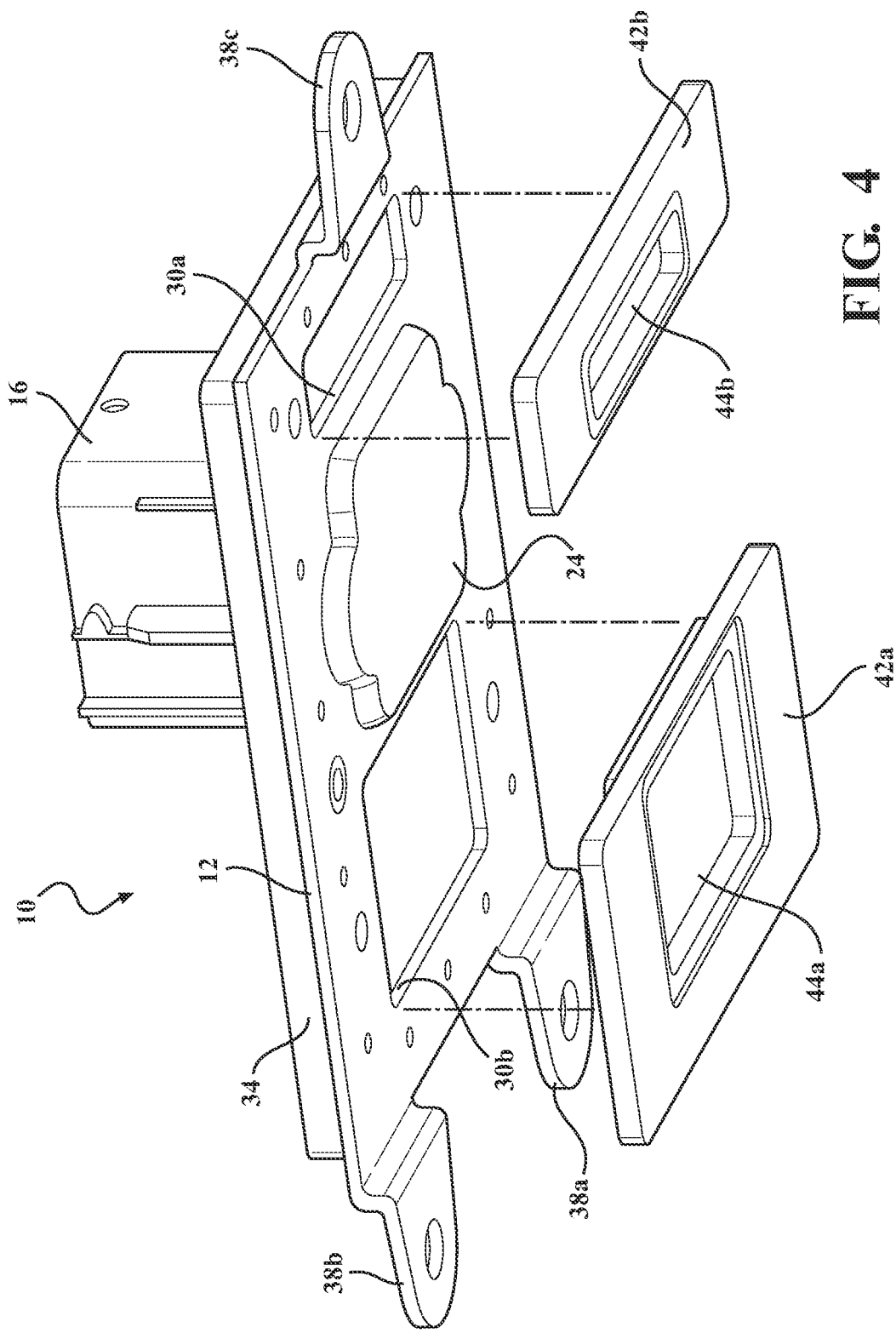
FIG. 4 is a partially exploded view of a control unit, according to embodiments of the present invention.
Figure 5:
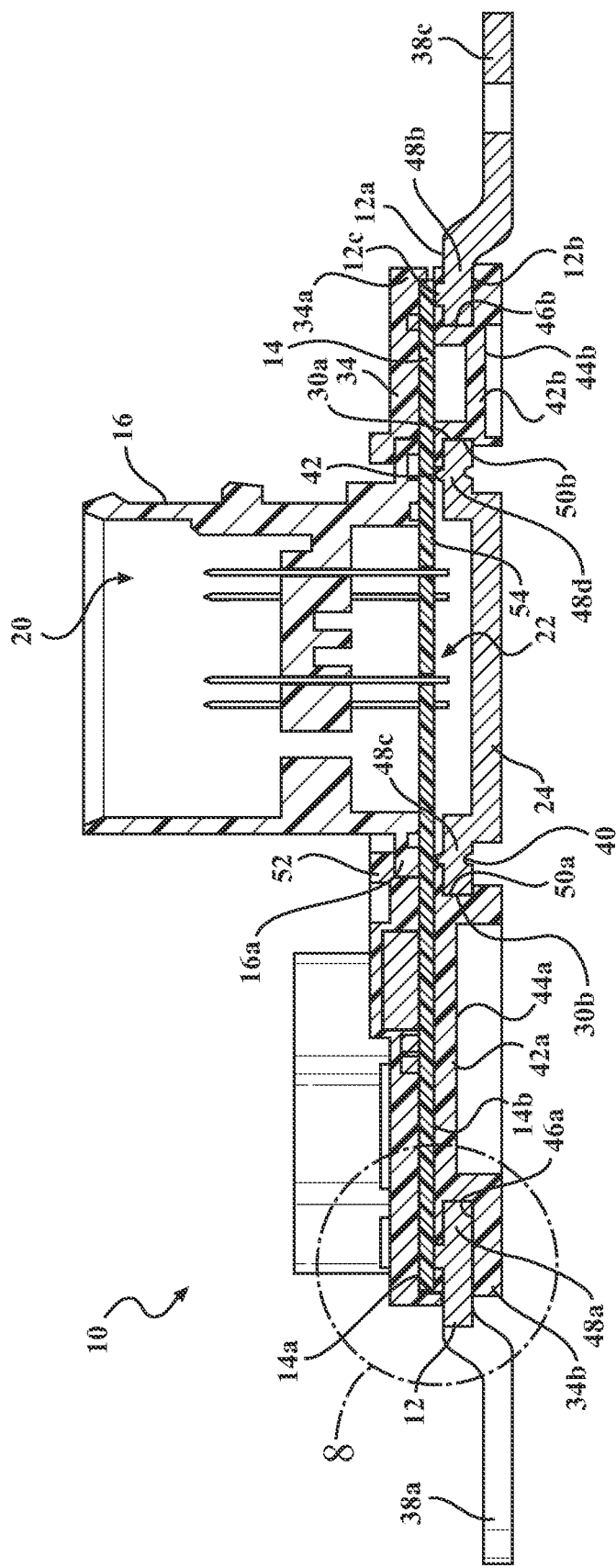
FIG. 5 is a sectional view taken along lines 5-5 of FIG. 1.

Integrally formed as part of the PCB 14 is a first plurality of assembly apertures 26, and integrally formed as part of the base plate 12 is a second plurality of assembly apertures 28. In this embodiment, there are a total of four assembly apertures 26 formed as part of the PCB 14, and four assembly apertures 28 formed as part of the base plate 12, but it is within the scope of the invention that more of less assembly apertures may be formed as part of the PCB 14 and the base plate 12, respectively. Also integrally formed as part of the base plate 12 are two flow apertures 30a,30b. A plurality of standoffs 12c, best seen in FIGS. 3, 5, and 8, is formed as part of the first side 12a of the base plate 12. Referring to FIG. 3, there is also a first alignment standoff 12d and a second alignment standoff 12e which are formed as part of the first side 12a of the base plate 12. The alignment standoffs 12c,12d are greater in height than the standoffs 12c, such that the alignment standoffs 12c,12d protrude a greater distance away from the PCB 14 compared to the standoffs 12c.

In the present embodiment, the base plate 12 is made from aluminum, but it is within the scope of the invention that other materials may be used. The base plate 12 is formed using a stamping process, and during the stamping process, the base plate 12 is stamped from a metal blank, such that the standoffs 12c and the alignment standoffs 12d,12e are formed, as well as the cover 24, and several connecting flanges 38a,38b,38c. As a result of the stamping process, there is a circumferential groove 40 which is pressed into the second side 12b of the base plate 12, which results in the formation of a corresponding circumferential lip 42 on the first side 12a of the base plate 12.

Referring to the Figures generally, during assembly, the connector shroud 16 is placed in contact with the first side 14a of the PCB 14, and the connector shroud 16 is properly aligned by alignment pins 32 which extend into the connector shroud 16 as the connector shroud 16 is placed in contact with the PCB 14. The connector shroud 16 also includes a circumferential flange 16a which is placed in contact with the first side 14a of the PCB 14 during assembly. The PCB 14 is then positioned such that each alignment standoff 12c,12d extends into a corresponding aperture (not shown) formed as part of the PCB 14, and the second side 14b of the PCB 14 is in contact with the standoffs 12c and the circumferential lip 42 of the base plate 12 such that each of the first plurality of assembly apertures 26 is aligned with a corresponding one of the second plurality of assembly apertures 28. The alignment standoffs 12d,12e extending into corresponding apertures of the PCB 14 provide proper positioning of the base plate 12 and PCB 14 relative to one another during manufacturing.

The desired positioning of the connector shroud 16, the PCB 14, and the base plate 12 forms a pre-assembly. The pre-assembly includes the connector shroud 16 being placed in contact with the first side 14a of the PCB 14, and the second side 14b of the PCB 14 being placed in contact with the standoffs 12c and the circumferential lip 42 as described above. The pre-assembly is placed into a tooling device, or a molding device, where several holding devices, such as clamps or the like, hold the pre-assembly in place while an epoxy material is injected into the tooling device during an over molding process. The epoxy material is injected into the tooling device to form an encapsulation housing 34, which surrounds various parts of the base plate 12, the PCB 14, and the connector shroud 16 to function as a connection structure. The encapsulation housing 34 includes a first layer 34a on the first side 14a of the PCB 14, and second layer 34b on the second side 12b of the base plate 12.

Figure 6:
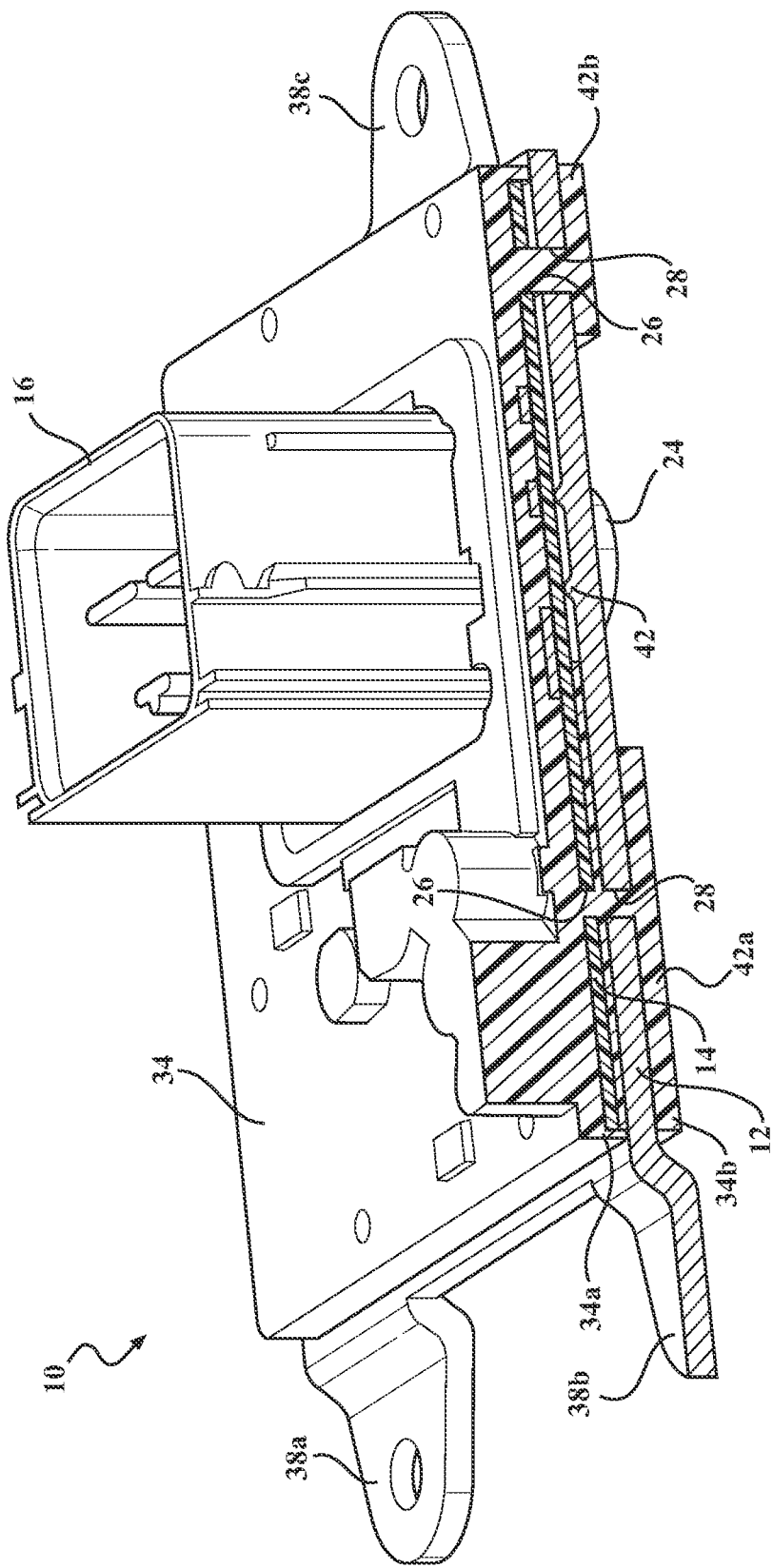
FIG. 6 is a sectional view taken along lines 6-6 of FIG. 1.

During the over molding process, the epoxy material is injected into the tooling device such that at least a portion of the material flows through the first plurality of assembly apertures 26 and the second plurality of assembly apertures 28, and portions of the epoxy material also flow through the flow apertures 30a,30b. The shape of the layers 34a,34b is determined by the shape of the tooling device. Once the over molding process is complete, the areas 58 of the epoxy material which form part of the encapsulation housing 34 that extend through the first plurality of assembly apertures 26 and the second plurality of assembly apertures 28 is shown in FIGS. 6-7.

Referring again to the Figures generally, in the embodiment shown, once the over molding process is complete, the first layer 34a encapsulates most of the first side 14a of the PCB 14 and also the circuitry 18, with the exception of the area of the first side 14a of the PCB 14 which the connector shroud 16 is attached to. Also, once the over molding process is complete, several stanchions 60 are integrally formed as part of the encapsulation housing 34. More specifically, the stanchions 60 are integrally formed with the first layer 34a, the second layer 34b, and the third layer 34c. Each of the stanchions 60 extend through one of the first plurality of assembly apertures 26 and one of the second plurality of assembly apertures 28. Part of the encapsulation housing 34 is also disposed between and in contact with the base plate 12 and the PCB 14, with the exception of the areas of the PCB 14 which are in contact with the standoffs 12c, the alignment standoffs 12d,12e, and the circumferential lip 42, and the area 54 of the PCB 14 which the circumferential lip 42 prevents the epoxy from contacting during the over molding process. This area 54 is adjacent the cavity 22 of the cover 24. Also, once the over molding process is complete, the second layer 34b does not contact the entire second side 12b of the base plate 12. The second layer 34b contacts the second side 12b in the areas of the base plate 12 which are unoccupied by the cover 24, and the second layer 34b does not contact areas 36 of the base plate 12 which are adjacent the cover 24. The encapsulation housing 34 also surrounds each peripheral wall 56a,56b,56c,56d of the PCB 14. Once the over molding process is completed, the PCB 14 is protected from, and prevented from coming in contact with, fluids or gases.

The second layer 34b has two parts which are located on the second side 12b of the base plate 12. There is a first part 42a which is adjacent the cover 24, and a second part 42b which adjacent the cover 24 on the opposite side of the cover 24 as the first part 42a. The first part 42a has a recess 44a and the second part 42b has a second recess 44b, such that amount of epoxy used to create the second layer 34b is minimized, reducing the overall weight of the control unit 10, while still maintaining the proper structural integrity. The inclusion of the recesses 44a,44b also results in a reduction in thickness of the parts 42a,42b, which facilitates an even curing of the epoxy during the overmolding process.

Once the over molding process is complete, there are several grooves formed as part of the encapsulation housing 34, and portions of the base plate 12 are located in the grooves. Referring to FIGS. 5-7, there is a first groove 46a which a first portion 48a of the base plate 12 extends into, and a second groove 46b which a second portion 48b of the base plate 12 extends into. Additionally, there is also a first shallow groove 50a in which a third portion 48c extends into, and a second shallow groove 50b in which a fourth portion 48d extends into. Both of the shallow grooves 50a,50b are adjacent different parts of the circumferential groove 40.

Once the overmold process is complete, the circumferential flange 16a is located between a portion 52 of the encapsulation housing 34 and the PCB 14, securing the connector shroud 16 to the PCB 14.

The control unit 10 described may be suitable for any type of application where a control unit is required, such as, but not limited to, an engine control unit, a transmission control unit, or the like.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus, comprising:
 a control unit, including:
 a base plate;
 a printed circuit board (PCB) connected to the base plate;
 circuitry mounted to the PCB;
 at least one flow aperture integrally formed as part of the base plate; and
 an encapsulation housing including:
 an epoxy overmolded around portions of the base plate, portions of the circuitry, and portions of the PCB,
 a first layer disposed on a side of the PCB, and
 a second layer disposed on a side of the base plate, the first layer and the second layer are connected together and connect the PCB to the base plate;
 wherein the base plate and the PCB are connected together by the encapsulation housing, and
 wherein at least a portion of the encapsulation housing is disposed in the at least one flow aperture, in between the first layer and the second layer.

2. The apparatus of claim 1, further comprising:
 at least one recess formed as part of the second layer of the encapsulation housing;
 wherein a portion of the base plate is adjacent the at least one recess.

3. The apparatus of claim 1, further comprising:
 a first plurality of assembly apertures integrally formed as part of the PCB; and
 a second plurality of assembly apertures integrally formed as part of the base plate;
 wherein each of the first plurality of assembly apertures is aligned with a corresponding one of the second plurality of assembly apertures, and a portion of the encapsulation housing extends through each of the first plurality of assembly apertures and the second plurality of assembly apertures.

4. The apparatus of claim 1, wherein at least a portion of the circuitry is covered by the encapsulation housing.

5. The apparatus of claim 1, further comprising:
 a connector shroud mounted to the PCB in an area of the PCB unoccupied by the encapsulation housing; and
 at least one circumferential flange being part of the connector shroud and in contact with the PCB;
 wherein the at least one circumferential flange is disposed between a portion of the encapsulation housing and the PCB, securing the connector shroud to the PCB.

6. The apparatus of claim 1, further comprising:
 a cover integrally formed as part of the base plate; and
 a cavity integrally formed as part of the cover;
 wherein a portion of the encapsulation housing is adjacent the cover, and the cover is adjacent the PCB in an area of the PCB unoccupied by the encapsulation housing.

7. The apparatus of claim 6, further comprising:
 a circumferential lip integrally formed as part of the base plate such that the circumferential lip circumscribes the cover;
 wherein a portion of the encapsulation housing is adjacent the circumferential lip.

8. The apparatus of claim 1, further comprising:
 at least one groove integrally formed as part of the encapsulation housing;
 wherein a portion of the base plate is disposed in the at least one groove, connecting the base plate and the encapsulation housing.

9. A method for making a control unit, comprising the steps of:
 providing a base plate;
 providing a printed circuit board (PCB); and
 providing circuitry mounted to the PCB;
 providing a connector shroud;
 providing at least one circumferential flange being part of the connector shroud;
 placing the PCB in contact with the base plate;

overmolding an epoxy around portions of the base plate, portions of the circuitry, and portions of the PCB to form an encapsulation housing which connects the base plate to the PCB;

mounting the connector shroud to the PCB in an area unoccupied by the encapsulation housing such that the at least one circumferential flange is in contact with the PCB, and a portion of the circuitry is surrounded by the connector shroud; and over molding the epoxy is around portions of the base plate and the PCB such that the at least one circumferential flange is disposed between a portion of the encapsulation housing and the PCB, securing the connector shroud to the PCB.

10. The method of claim 9, further comprising the steps of overmolding the epoxy around portions of the base plate and the PCB such that a first layer of the encapsulation housing is disposed on a side of the PCB, and a second layer of the encapsulation housing is disposed on a side of the base plate.

11. The method of claim 10, further comprising the steps of:

providing at least one flow aperture integrally formed as part of the base plate;

overmolding the epoxy around portions of the base plate and the PCB such that at least a portion of the encapsulation housing is disposed in the at least one flow aperture, in between the first layer and the second layer.

12. The method of claim 11, further comprising the steps of providing at least one recess formed as part of the second layer of the encapsulation housing when the epoxy is overmolded around portions of the base plate and the PCB, such that a portion of the base plate is adjacent the at least one recess.

13. The method of claim 9, further comprising the steps of:

providing a first plurality of assembly apertures integrally formed as part of the PCB; and providing a second plurality of assembly apertures integrally formed as part of the base plate;

aligning each of the first plurality of assembly apertures with a corresponding one of the second plurality of assembly apertures as the PCB is placed in contact with the base plate, such that a portion of the encapsulation housing extends through each of the first plurality of assembly apertures and the second plurality of assembly apertures once the epoxy is overmoled around portions of the base plate and the PCB.

14. The method of claim 9, further comprising the steps of:

providing a cover integrally formed as part of the base plate; and providing a cavity integrally formed as part of the cover, such that a portion of the encapsulation housing is adjacent the cover as the epoxy is overmolded around portions of the base plate and the PCB.

15. The method of claim 9, further comprising the steps of:

providing at least one groove integrally formed as part of the encapsulation housing;

overmolding the epoxy around portions of the base plate and the PCB to form the encapsulation housing such that a portion of the base plate is disposed in the at least one groove.

* * * * *